(12) United States Patent
Wodnicki

(10) Patent No.: US 6,759,888 B1
(45) Date of Patent: Jul. 6, 2004

(54) METHOD AND APPARATUS FOR HIGH-VOLTAGE SWITCHING OF ULTRASOUND TRANSDUCER ARRAY

(75) Inventor: Robert G. Wodnicki, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/605,093

(22) Filed: Sep. 8, 2003

Related U.S. Application Data

(63) Continuation-in-part of application No. 10/248,968, filed on Mar. 6, 2003.

(51) Int. Cl.[7] .............................................. H03K 17/16
(52) U.S. Cl. ........................ 327/382; 327/434; 323/315
(58) Field of Search ................................ 327/365, 382, 327/427, 434; 326/37, 38; 323/315, 316; 330/288

(56) References Cited

U.S. PATENT DOCUMENTS

| | | | | |
|---|---|---|---|---|
| 4,595,847 A | * | 6/1986 | Weir | 327/382 |
| 5,212,474 A | * | 5/1993 | Muhlemann | 345/208 |
| 6,288,603 B1 | * | 9/2001 | Zanuccoli et al. | 327/544 |

\* cited by examiner

*Primary Examiner*—Kenneth B. Wells
(74) *Attorney, Agent, or Firm*—Ostrager Chong & Flaherty LLP

(57) ABSTRACT

A high-voltage switching circuit comprising: a switch having ON and OFF states and having a parasitic gate capacitance and a control circuit for turning the switch on and off. The switch comprises a pair of DMOS FETs having a shared gate terminal, the sources of the DMOS FETs being connected to each other and the drains of the DMOS FETs being connected to the input and output terminals of the switch respectively, and biased at a bias voltage level. The control circuit comprises: a programming transistor having its drain connected to the shared gate terminal of the switch, its source connected to receive a programming voltage, and its gate connected to receive a programming transistor gate voltage; first circuitry for causing a first transition from a first level to a second (lower) level of the programming voltage; and second circuitry for causing a second transition from a first level to a second level of the programming transistor gate voltage. The second level of the programming voltage is higher than the bias voltage level by an amount sufficient to turn on the switch. The first level of the programming transistor gate voltage is approximately equal to the first level of the programming voltage, and the second level of said programming transitor gate voltage is lower than the second level of the programming voltage by an amount sufficient to turn on the programming transistor, whereby the second level of the programming voltage is applied to the shared gate terminal of the switch via the programming transistor.

41 Claims, 6 Drawing Sheets

METHOD AND APPARATUS FOR HIGH-VOLTAGE SWITCHING OF ULTRASOUND TRANSDUCER ARRAY

CROSS REFERENCE TO RELATED APPLICATIONS

This application is a continuation-in-part and claims priority from U.S. patent application Ser. No. 10/248,968 filed on Mar. 6, 2003 and entitled "Integrated High-Voltage Switching Circuit for Ultrasound Transducer Array".

FEDERAL RESEARCH STATEMENT

[The United States Government may have certain rights in this invention pursuant to U.S. Government Contract Number DAMD17-02-1-0181 awarded by the U.S. Army.]

BACKGROUND OF INVENTION

This invention generally relates to integrated high-voltage switching circuitry. In particular, the invention relates to integrated high-voltage switching circuitry for use in conjunction with an array of elements. Such arrays include, but are not limited to, ultrasound transducer arrays, liquid crystal display pixel arrays, and so forth.

For the purpose of illustration, various embodiments of the invention will be described with reference to an ultrasound transducer array, e.g., the so-called "mosaic annular array", for use in ultrasound imaging. A mosaic annular array employs the idea of dividing the active aperture of an ultrasound transducer into a mosaic of very small subelements and then forming annular elements from these subelements by interconnecting them with electronic switches. However, the geometry of the array elements is not limited to annular shapes. These array "elements" can be "moved" electronically along the surface of the mosaic array to perform scanning by changing the switch configuration. Other element configurations permit beamsteering, which will provide the ability to acquire volumetric data sets. A configuration of multiple concentric annular elements provides optimal acoustic image quality by matching the element shapes to the acoustic phase fronts. The switches of the present invention are not limited to use in mosaic arrays, but rather could be used with standard ultrasound transducers.

Conventional ultrasound imaging systems comprise an array of ultrasonic transducers that are used to transmit an ultrasound beam and then receive the reflected beam from the object being studied. Such scanning comprises a series of measurements in which the focused ultrasonic wave is transmitted, the system switches to receive mode after a short time interval, and the reflected ultrasonic wave is received, beamformed and processed for display. Typically, transmission and reception are focused in the same direction during each measurement to acquire data from a series of points along an acoustic beam or scan line. The receiver is dynamically focused at a succession of ranges along the scan line as the reflected ultrasonic waves are received.

For ultrasound imaging, the array typically has a multiplicity of transducers arranged in one or more rows and driven with separate voltages. By selecting the time delay (or phase) and amplitude of the applied voltages, the individual transducers in a given row can be controlled to produce ultrasonic waves that combine to form a net ultrasonic wave that travels along a preferred vector direction and is focused in a selected zone along the beam.

The same principles apply when the transducer probe is employed to receive the reflected sound in a receive mode. The voltages produced at the receiving transducers are summed so that the net signal is indicative of the ultrasound reflected from a single focal zone in the object. As with the transmission mode, this focused reception of the ultrasonic energy is achieved by imparting separate time delay (and/or phase shifts) and gains to the signal from each receiving transducer. The time delays are adjusted with increasing depth of the returned signal to provide dynamic focusing on receive.

The quality or resolution of the image formed is partly a function of the number of transducers that respectively constitute the transmit and receive apertures of the transducer array. Accordingly, to achieve high image quality, a large number of transducers is desirable for both two- and three-dimensional imaging applications. The ultrasound transducers are typically located in a hand-held transducer probe that is connected by a flexible cable to an electronics unit that processes the transducer signals and generates ultrasound images. The transducer probe may carry both ultrasound transmit circuitry and ultrasound receive circuitry.

It is known to include high-voltage components in the transmit circuitry to drive the individual ultrasound transducers, while low-voltage, high-density digital logic circuitry is used to provide transmit signals to the high-voltage drivers. The high-voltage drivers typically operate at voltages of up to approximately 100 volts, while the low-voltage logic circuitry has an operating voltage on the order of 5 volts in the case of TTL logic. The high-voltage drivers may be fabricated as discrete components or as integrated circuits, while the low-voltage logic circuitry may be fabricated as a separate integrated circuit or combined with the high-voltage circuitry on a single chip. In addition to transmit circuitry including the high-voltage drivers and low-voltage logic circuitry, the transducer head may include low-noise, low-voltage analog receive circuitry. The low-voltage receive circuitry, like the transmit logic circuitry, typically has an operating voltage on the order of 5 volts, and may be a separate integrated circuit or may be fabricated with the low-voltage transmit logic circuitry as a monolithic integrated circuit.

In order to maximize the number of transducers to achieve high-quality ultrasound images, it is desirable to integrate as much circuitry as possible in as small a volume as possible to reduce the size and complexity of the circuitry, whether the circuitry be located within a transducer probe or in an electronics unit separate therefrom. In addition, some applications, for example, very high-frequency ultrasound imaging, require that transmit circuitry be located as close as possible to the transducers to avoid signal loading by a long cable.

In addition, the integrated circuit must include switches for coupling selected ultrasound transducers of the array with the associated high-voltage drivers during transmit and with associated receivers during receive. One proposed ultrasound transducer array that employs integrated high-voltage driving circuits is a so-called "mosaic annular array". In a mosaic annular array ultrasound probe there is a need for both matrix and access switches that can withstand the high voltages used on transmit. At the same time, since the array contains upwards of 40,000 switches, low-power operation is an important consideration. In addition, it must be possible to cascade many such switches in series. Finally, the switch should have the ability to retain its state independent of additional logic, thereby simplifying the required digital circuitry and also enabling the use of different transmit and receive apertures.

Currently, ultrasound machines use commercially available high-voltage switch integrated circuits that are generally packaged in groups of eight switches per device. A representative patent for this technology is U.S. Pat. No. 4,595,847. Generally, this device uses high-voltage DMOS switches that are integrated back to back. This is well known in the prior art as a requirement due to the parasitic body diodes that are contained in the devices. [See, for example, "Using the Power MOSFET's Integral Reverse Rectifier," Fragale et al., Proc. PowerCon 7: Seventh National Solid-State Power Conversion Conference, San Diego, Calif., March 1980.] An important feature of this device is the ability to tolerate high voltages on both of the signal terminals while floating the gate control terminal relative to this voltage. A level shifter is employed to allow the switch to operate in this manner.

An application similar to that of the present invention is driving a liquid crystal display (LCD). The LCD requires high voltages (100 V) but does not require high current. A solution to the LCD driver problem is disclosed by Doutreloigne et al. in a paper entitled "A Versatile Micropower High-Voltage Flat-Panel Display Driver etc." and also in European Published Patent Application No. 1089433. This device also uses high-voltage DMOS switches; however, it uses a dynamically biased level shifter. The advantage of using a dynamically biased level shifter is that it does not dissipate static power. The technique of dynamic storage of control voltage is well known in the prior art and is most often found in dynamic shift registers and in dynamic RAM, which are prevalent in commercial electronics. In particular, U.S. Pat. No. 5,212,474 discloses a high-voltage level shifter that uses dynamic storage of voltage to effect a low-power and small-form factor device.

In U.S. Pat. No. 6,288,603, Zanuccoli et al. disclose a high-voltage bidirectional switch that operates in a similar fashion to that disclosed by Doutreloigne et al., with the improved ability to operate independent of supply voltages at the switch terminals. This device also uses a dynamic level shifter that stores a control voltage on the gate of the switch FET. The device is adapted for operation with a single NMOS device and goes to great length to make this possible.

There is a need in an ultrasound transducer array for both matrix and access switches that can withstand the high voltages used on transmit while consuming low power. It must be possible to cascade many such switches in series. Also, in a mosaic annular array, integrated high-voltage switching elements are required which are as small as possible in order to fit into the tight pitch between ultrasound transducers. Finally, these switches should have the ability to retain their state independent of additional logic and with controlled variation of ON resistance.

SUMMARY OF INVENTION

The present invention is directed to high-voltage switching circuits, devices incorporating high-voltage switching circuits and methods of programming high-voltage switching circuits. Although the disclosed embodiments are suitable for use in an ultrasound transducer array, the high-voltage switching circuits disclosed herein are not limited to ultrasound imaging applications.

One aspect of the invention is a method of operating a switch having ON and OFF states and having a parasitic gate capacitance, the switch comprising a pair of DMOS FETs having a shared gate terminal, the sources of the DMOS FETs being connected to each other and the drains of the DMOS FETs being connected to the input and output terminals of the switch respectively, and the shared gate terminal being connected to a drain of a programming transistor, the gate of the programming transistor receiving a gate voltage, the source of the programming transistor receiving a programming voltage, and the drains of the DMOS FETs being biased at a bias voltage level. The method comprises the following steps: (a) transitioning from a first level of the programming voltage to a second level of the programming voltage, the second level of the programming voltage being lower than the first level of the programming voltage and being higher than the bias voltage level by an amount sufficient to turn on the switch; and (b) transitioning from a first level of the programming transistor gate voltage to a second level of the programming transistor gate voltage, the first level of the programming transistor gate voltage being approximately equal to the first level of the programming voltage, and the second level of the programming transistor gate voltage being lower than the second level of the programming voltage by an amount sufficient to turn on the programming transistor, whereby the second level of the programming voltage is applied to the shared gate terminal of the switch via the programming transistor.

Another aspect of the invention is a circuit comprising: a switch having ON and OFF states and having a parasitic gate capacitance, the switch comprising a pair of DMOS FETs having a shared gate terminal, the sources of the DMOS FETs being connected to each other and the drains of the DMOS FETs being connected to the input and output terminals of the switch respectively, and biased at a bias voltage level; and a control circuit for turning the switch on and off, the control circuit comprising: a programming transistor having its drain connected to the shared gate terminal of the switch, its source connected to receive a programming voltage, and its gate connected to receive a programming transistor gate voltage; first circuitry for causing a first transition from a first level of the programming voltage to a second level of the programming voltage, the second level of the programming voltage being lower than the first level of the programming voltage and being higher than the bias voltage level by an amount sufficient to turn on the switch; and second circuitry for causing a second transition from a first level of the programming transistor gate voltage to a second level of the programming transistor gate voltage, the first level of the programming transistor gate voltage being approximately equal to the first level of the programming voltage, and the second level of the programming transistor gate voltage being lower than the second level of the programming voltage by an amount sufficient to turn on the programming transistor, whereby the second level of the programming voltage is applied to the shared gate terminal of the switch via the programming transistor.

A further aspect of the invention is a circuit comprising: a switch having ON and OFF states and having a parasitic gate capacitance, the switch comprising a pair of DMOS FETs having a shared gate terminal, the sources of the DMOS FETs being connected to each other and the drains of the DMOS FETs being connected to the input and output terminals of the switch respectively; a control circuit for turning the switch on and off, the control circuit comprising a first level shifter having an input terminal and an output terminal, and a programming transistor having its drain connected to the shared gate terminal of the switch, having its source connected to a first terminal from which the programming transistor draws current, and having its gate connected to receive a voltage derived from a voltage output by the first level shifter; and a resistance connected across the switch output terminal and a second terminal. The switch turns on in response to the following conditions: a first gate control voltage level is applied to the input terminal of the first level shifter that results in the programming transistor passing current, while first and second bias voltage levels are respectively applied to the first and second terminals to produce a switch gate-source voltage that turns the switch on.

Yet another aspect of the invention is a device comprising: a switch having ON and OFF states and having a parasitic gate capacitance, the switch comprising a pair of DMOS FETs having a shared gate terminal, the sources of the DMOS FETs being connected to each other and the drains of the DMOS FETs being connected to the input and output terminals of the switch respectively, and biased at a bias voltage level; and a control circuit for turning the switch on and off, the control circuit having first and second control states, each of the first and second control states being a function of a programming voltage and a programming gate voltage applied to different terminals of the control circuit. In the first control state of the control circuit, the programming voltage has a first voltage level and the programming gate voltage has a voltage level less than the first voltage level, resulting in the switch being on. In the second control state of the control circuit, the programming voltage has a second voltage level less than the first voltage level and the programming gate voltage has a voltage level less than the second voltage level, resulting in the switch being off.

A further aspect of the invention is a method of operating a high-voltage switching circuit, comprising the following steps: programming a first ON resistance value for tile high-voltage switching circuit under a first set of operating conditions, comprising a first value for a predetermined parameter, by applying a first programming voltage to a gate of the high-voltage switching circuit; determining that the parameter has changed from the first value to a second value under a second set of operating conditions; and programming a second ON resistance value for the high-voltage switching circuit under the second set of operating conditions by applying a second programming voltage different than the first programming voltage to the gate.

Yet another aspect of the invention is a method for programming high-voltage switching circuits, comprising the following steps: (a) manufacturing first and second high-voltage switching circuits; (b) determining a first gate-source voltage that causes the first high-voltage switching circuit to have a desired ON resistance; (c) determining a second gate-source voltage that causes the second high-voltage switching circuit to have the desired ON resistance, the first and second gate-source voltages being different; (d) programming a control circuit to provide a first gate voltage to the first high-voltage switching circuit, the first gate voltage being dependent on the results of step (b); and (e) programming the control circuit to provide a second gate voltage to the second high-voltage switching circuit, the second gate voltage being dependent on the results of step (c), wherein the first and second gate voltages are different but produce approximately the same ON resistances during operation of the first and second high-voltage switching circuits.

Other aspects of the invention are disclosed and claimed below.

DETAILED DESCRIPTION

Figure 1:
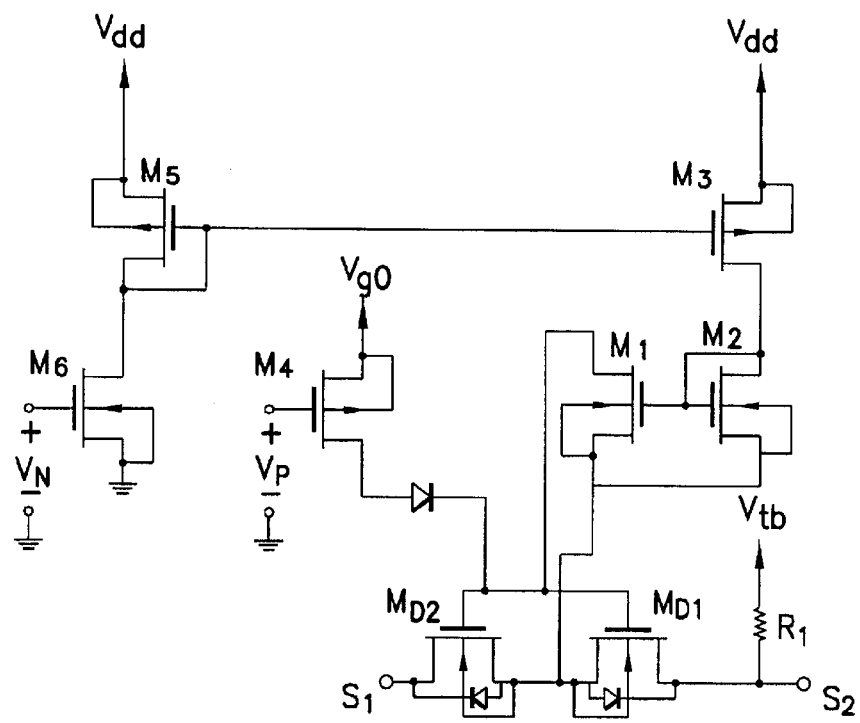
FIG. 1 is a diagram showing a high-voltage switching circuit that is disclosed in U.S. patent application Ser. No. 10/248,968.

At the outset it should be noted that the connections to ground shown in the drawings are simplifications. In each of the embodiments disclosed herein, the ground terminal is likely to be connected to a negative voltage which is often called $V_{SS}$. While it is simplest to show this as ground and in some cases ground is in fact used, It is understood that ground is simply a reference voltage and that other voltages both positive and negative (with respect to ground) could also be used depending on the application.

The invention is directed to switching circuits that solve the aforementioned problems. A large number of switches can be directly integrated in a high-voltage CMOS process to withstand ultrasound transmit pulse voltages.

The gate voltage can be uniquely programmed for each switch. The invention provides for low power operation and allows switches to be cascaded without any substantial leakage current when the switch is on. Also, the invention provides switches that have their own local memory, i.e., the switches have the ability to memorize switch state. In addition, the invention provides switches that are small enough for use in a mosaic annular array. Various embodiments of the invention will now be described with reference to the drawings for the purpose of illustration.

FIG. 1 shows a high-voltage switching circuit disclosed in U.S. patent application Ser. No. 10/248,968. Transistors $M_{D1}$ and $M_{D2}$ are DMOS FETs that are connected back to back (source nodes shorted together) to allow for bipolar operation. This connection is necessary due to the parasitic body diodes (as shown in the schematic) that would otherwise provide a conduction path from drain to source of either device during the positive or negative phase of the ultrasound transmit pulse.

In the embodiment shown in FIG. 1, current flows through the switch terminals $S_1$ and $S_2$ whenever both $M_{D1}$ and $M_{D2}$ are turned on. To turn on the switch, the gate voltage of these devices must be greater than their source voltage by a threshold voltage. Above the threshold voltage, switch ON resistance varies inversely with the gate voltage. Since the source voltage will be close to the drain voltage (for low ON resistance and low current), the source voltage will track the ultrasound transmit pulse voltage. In order for the gate-source voltage to remain constant, the gate voltage must also track the transmit pulse voltage. This can be achieved by isolating the source and gate from the switch control circuitry and providing a fixed potential at the gate with reference to the source. As described above, this is achieved in the prior art for ultrasound using static level shifters. In the embodiment shown in FIG. 1, a dynamic level shifter is used. This level shifter operates as follows: Transistor $M_4$ is a high-voltage PMOS transistor capable of withstanding the process maximum (e.g., 100 V) between its drain and source terminals. The source of transistor $M_4$ is biased at the global switch gate bias voltage $V_{g0}$ (nominally 5 V) as shown. In order to turn on the switch, the gate voltage $V_P$ of transistor $M_4$ is transitioned from high (5 V) to low (0 V), causing the global bias voltage $V_{g0}$ to be applied through transistor $M_4$ to the shared gate terminal of the FETs $M_{D1}$ and $M_{D2}$. The diode D1 is provided to prevent transistor $M_4$ from turning on when the DMOS switch gate voltage drifts above $V_{g0}$. Once the switch gate voltage has reached $V_{g0}$, the parasitic gate capacitance of the FETs $M_{D1}$ and $M_{D2}$ will retain this voltage. For this reason, once the switch gate voltage has stabilized, transistor $M_4$ can be turned off to conserve power. Leakage current at the drain of transistor $M_4$ will eventually dissipate the bias voltage at the switch gate, but this voltage can be reprogrammed periodically if necessary. The fact that the switch ON state is effectively stored on the switch gate capacitance means that the switch has its own memory, which is useful since extra state flip-flops do not need to be provided for that purpose.

When in the ON state, the switch can be turned off using gate clamp NMOS transistor $M_1$. This is done by applying a turn-on voltage to the gate of transistor $M_1$ using the level shifter composed of transistors $M_2$, $M_3$, $M_5$ and $M_6$. When this transistor is turned on, it forces the switch gate voltage to be equal to the switch source voltage, which moves the switch $M_{D1}$ and $M_{D2}$ to its OFF state. The action of making these voltages equal effectively dissipates the charge left on the gate capacitance after the turn-on operation described above. Once the charge is removed, transistor $M_1$ does not have to be left on. This means that the control level shifter circuit for this device can be turned off once the switch has stabilized, and this will save power. Again, the OFF state can be stored for an extended period and reprogrammed if necessary.

Still referring to FIG. 1, the circuit further comprises a bias resistor $R_1$, which allows one terminal (i.e., $S_2$) of the switch to be kept at a constant potential $V_{tb}$. This voltage is used to bias the ultrasound transducer that would ordinarily be connected at this terminal, and also acts as a "bleed resistor" to quickly return the transducer to its steady state. The addition of $R_1$ also makes it possible to cascade switches. Without the additional path to ground, it may not be possible to reliably turn on a switch that is isolated between two other switches that are turned off since the floating terminals are not at a known potential. Since the source voltage is effectively not controlled, omitting the bias resistor will cause an unpredictable voltage to be left on the DMOS gate-source terminals. This voltage may be too low to turn on the switch, may turn it on with the wrong ON resistance, or may be large enough to damage the device.

Figure 2:
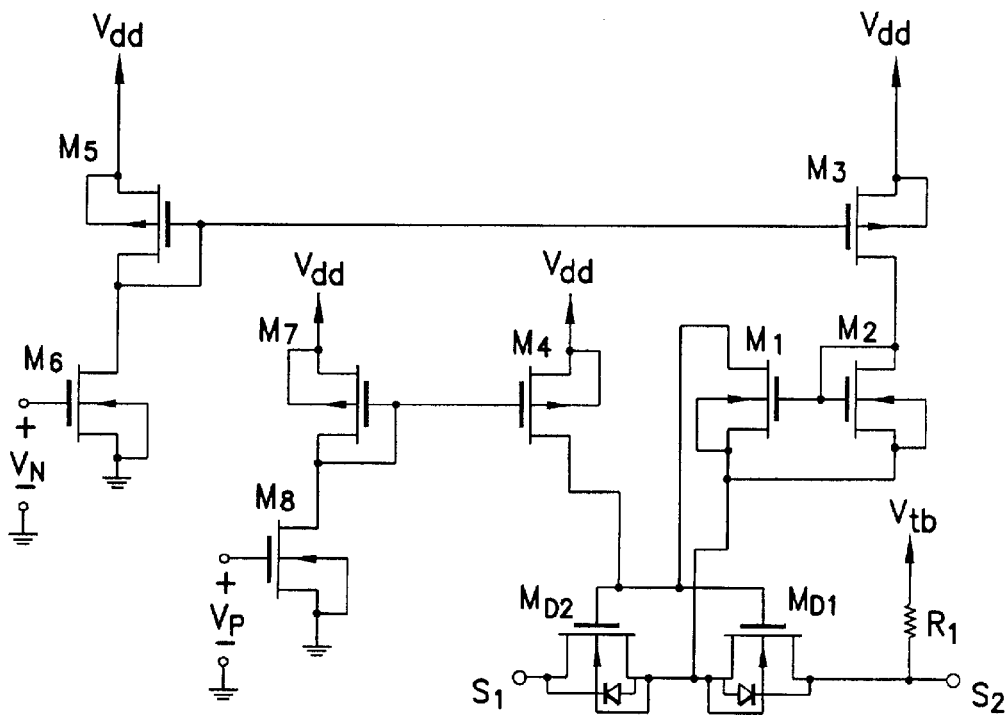
FIG. 2 is a diagram showing a high-voltage switching circuit in accordance with one embodiment of the invention.

FIG. 2 shows one embodiment of the present invention that reduces the size of the high-voltage switching circuit when fabricated. The diode $D_1$ (see FIG. 1) can be removed provided that the circuit is operated in a special way. Note that transistor $M_4$ is now biased relative to $V_{dd}$ and not $V_{g0}$. This removes an extra global signal line, which saves area. In addition, it allows all of the PMOS transistors ($M_3$, $M_4$, $M_5$ and $M_7$) to share the same doped well, which further improves circuit density. The transistors $M_7$ and $M_8$ provide a level shifter for the control voltage for this new biasing scheme. For the circuit shown in FIG. 1, ordinarily $V_{g0}$ is used to program a turn-on voltage across $V_{gs}$ of the two DMOS FETs $M_{D1}$ and $M_{D2}$ relative to the transducer bias voltage $V_{tb}$. In the circuit shown in FIG. 2, there are two ways to achieve the same effect without $V_{g0}$: 1) During programming, $V_{tb}$ is changed such that the difference $V_{dd}$-$V_{tb}$ is equal to the desired $V_{gs}$ to be programmed for switch turn-on. 2) During programming, $V_{dd}$ is changed such that the difference $V_{dd}$-$V_{tb}$ is equal to the desired $V_{gs}$ to be programmed for switch turn-on.

For example, in the case where $V_{dd}$ is changed a turn-on programming voltage level such that the difference $V_{dd}$-$V_{tb}$ is equal to the desired $V_{gs}$ to be programmed, $V_{dd}$ will transition between two voltage levels. When the ultrasound transducer is driven, the transmit pulse goes up to a high drive voltage, for example, 40 V. During driving of the transducer, $V_{dd}$ must be equal to at least the drive voltage, i.e., 40 V. During programming of the switch relative to the transducer bias voltage $V_{tb}$, however, the voltage $V_{dd}$ will transition down to a lower voltage level. For the purpose of discussion, it will be assumed that $V_{tb}$ is 20 V. Then in order to turn on the switch, the voltage $V_{dd}$ must transition from 40 V to a level whereat the difference between $V_{dd}$ and $V_{tb}$ is 5 to 10 V, depending on the gate-source voltage $V_{gs}$ at which the switch transistors turn on. In this case, $V_{dd}$ must transition from 40 V to 25–30 V for switch turn-on.

Still referring to FIG. 2, the gate programming transistor is designated $M_4$.

The gate-source voltage of this device is kept at zero volts until it is used to turn on the switch. This can be done, as shown in FIG. 2, using a level shifter (comprising transistors $M_7$ and $M_8$) that is also biased at the $V_{dd}$ voltage. In order to turn on the switch, transistor $M_4$ must be turned on such that charge can flow from $V_{dd}$ through transistor $M_4$ and onto the gates of transistors $M_{D1}$ and $M_{D2}$. In the case of the second of the two programming methods described in the preceding paragraph, this is accomplished by first lowering the voltage $V_{dd}$ to the turn-on programming voltage and then turning transistor $M_4$ on. To turn transistor $M_4$ on, its gate voltage is lowered below its source voltage by about 5 V, and in this case 5 V below whatever the turn-on programming voltage will be. This lowering of the gate voltage of transistor $M_4$ is accomplished by means of the level shifter ($M_7$ and $M_8$).

After the switch is turned on, the voltage $V_{dd}$ needs to return to the high voltage, i.e., 40 V in the example given above. This is because the signal swing passing through the switch is limited on the high end by $V_{dd}$. Thus, in order to pass a high-voltage pulse through the switch, $V_{dd}$ must be greater than the largest voltage that will be seen by the switch during the pulse.

During driving of the ultrasound transducer, the transistor $M_4$ remains off.

Still referring to FIG. 2, transistors $M_7$ and $M_8$ provide a level shifter for the $V_p$ input control voltage. This circuitry makes it possible to use a control voltage that is independent of the switch gate voltage $V_{dd}$. For example, $V_p$ could advantageously swing between 0–3.3 V or 0–1.5 V for low-power operation, while the switch gate control voltage $V_{dd}$ would be set between 25 and 30 V (as described above) depending on the types of DMOS FETs used.

The "$V_{dd}$" terminals could all be the same or they could be split: In the latter case, PMOS transistors $M_3$ and $M_5$ would share voltage $V_{dd1}$, while PMOS transistors $M_4$ and $M_7$ would share voltage $V_{dd2}$, where $V_{dd2}$ undergoes transitions and $V_{dd1}$ remains static. However, it is preferred that all of these transistors share the same voltage $V_{dd}$ since this means one less power line to route and they are all in the same well which saves layout area.

Figure 3:
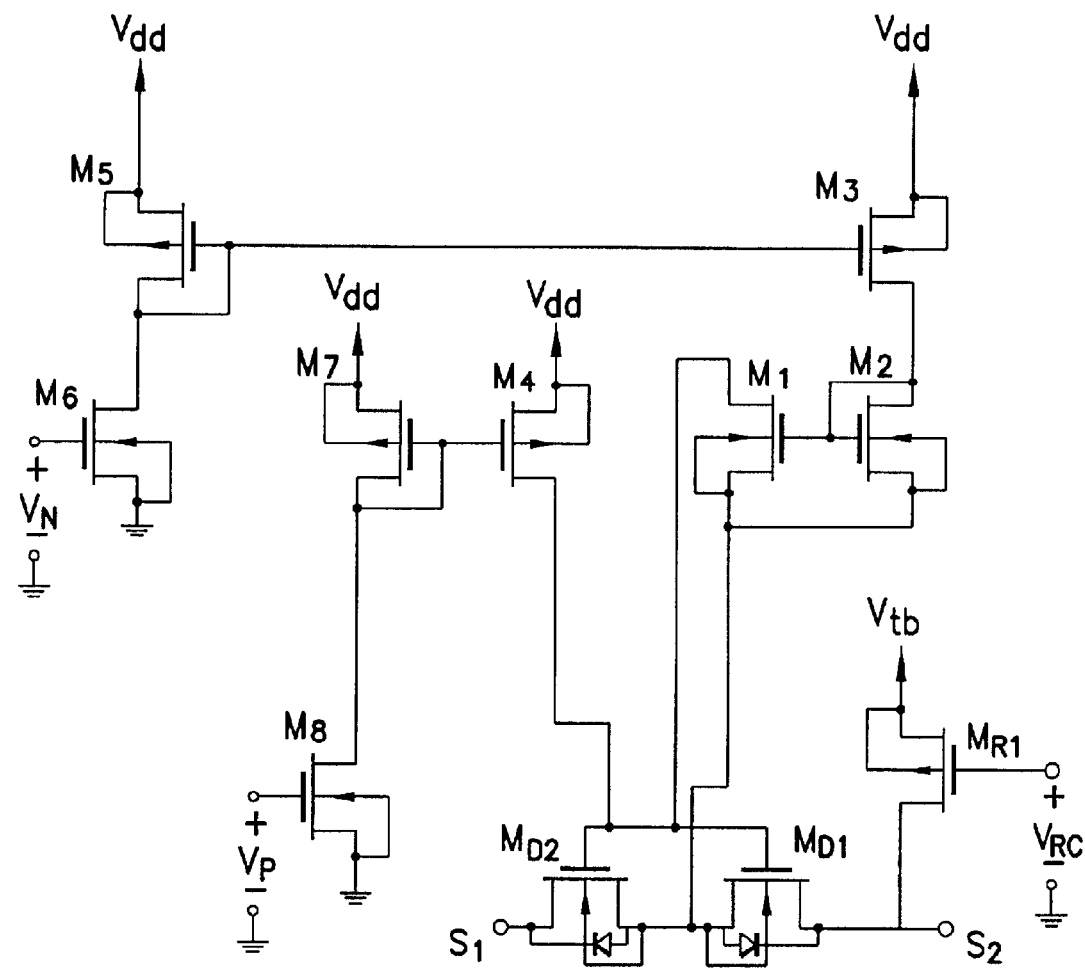
FIG. 3 is a diagram showing a high-voltage switching circuit in accordance with another embodiment of the invention.

FIG. 3 shows another embodiment of the invention that improves upon the circuit of FIG. 2. Here the transducer bias resistor $R_1$ in the circuit of FIG. 2 has been replaced by a MOSFET $M_{R1}$. The rest of the circuit is identical.

The MOSFET $M_{R1}$ is controlled using control voltage $V_{RC}$, which can be provided globally to the entire array, or controlled locally within each ultrasound transducer of the array. This amounts to a tradeoff between complexity in routing and complexity in local circuitry. The MOSFET $M_{R1}$ is biased by $V_{RC}$ such that a desired resistance is reached. The advantage of this improvement is that the value of the bias resistance can be adjusted. For example, since the resistance will change with temperature, a system can be provided that measures temperature and then adjusts the gate voltage of the resistor MOSFET $M_{R1}$ to tweak the resistance back to its optimal value. In addition, depending on the fabrication process used, the MOSFET $M_{R1}$ may take less area to fabricate and so will further improve the circuit density.

The MOSFET $M_{R1}$ replaces the bias resistor that would ordinarily be between the ultrasound transducer node and the $V_{tb}$ node. This resistance should be as high as possible so that neither the transmitter nor the transducer are loaded. Unfortunately, the higher the resistance, the larger the resistor needed, so there is usually a compromise value (on the order of 200 kilo-ohms). So using a MOSFET to provide the bias resistance, the resistance would likely be as high as it can be, but would again be limited by device sizing.

In addition to the resistor-based biased methods discussed above, it is also possible to use cascaded external biasing as is disclosed in U.S. patent application Ser. No. 10/248,968. As disclosed in this earlier patent application, by turning on switches in a serial fashion, it becomes possible to cascade the bias voltage through a network of switches which then do not require resistor biasing for operation.

Figure 4:
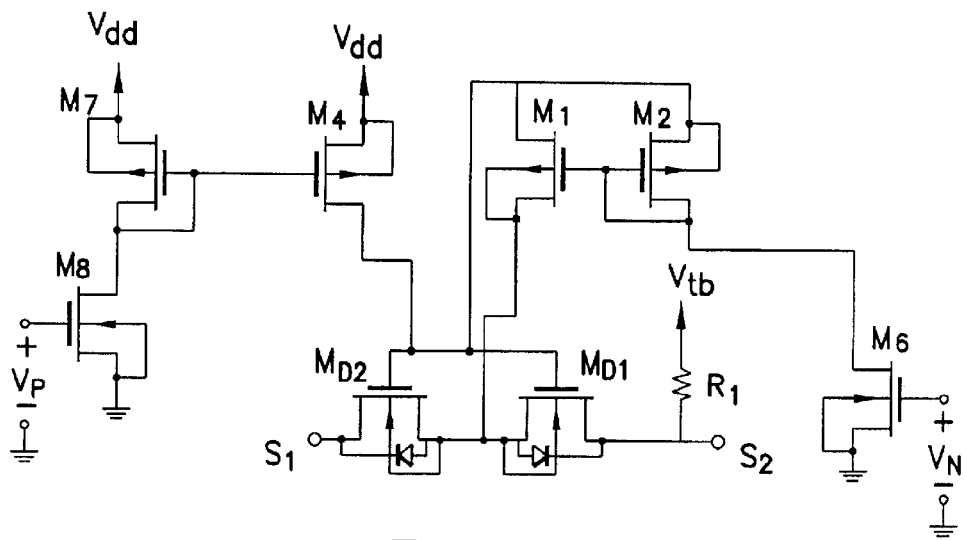
FIG. 4 is a diagram showing a high-voltage switching circuit with floating PMOS clamp circuit in accordance with a further embodiment of the invention.

An improvement to the circuit of FIG. 2 is shown in FIG. 4. This circuit operates in manner similar to the circuit in FIG. 2, with the difference being that the floating NMOS pair of transistors ($M_1$ and $M_2$) that clamp the DMOS transistor gate voltage have been replaced with floating PMOS transistors.

This difference is significant because in some CMOS processes, floating NMOS transistors are not available, and the transistors must float in order for the circuit to work correctly. This change also simplifies the circuit somewhat by reducing the number of level shifter transistors required (i.e., transistors $M_3$ and $M_5$ in the circuit of FIG. 2 have been eliminated).

Figure 5:
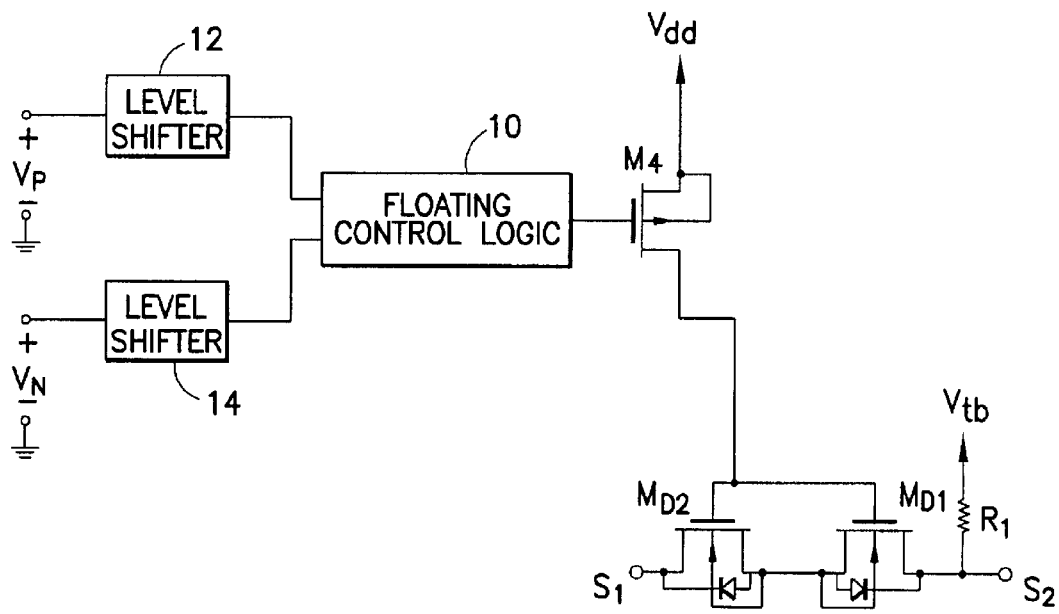
FIG. 5 is a diagram showing a high-voltage switching circuit with floating control logic in accordance with yet another embodiment of the invention.

FIG. 5 shows a circuit that is an extension of the concept embodied by the circuit in FIG. 2. In the circuit of FIG. 5, the clamp circuit has been eliminated entirely. The advantage of this arrangement is that the circuit is much smaller since it does not need to use the clamp transistors and their associated level shifter. Level shifters 12 and 14 are still required for communication with the floating control logic 10, however the level shifters are shared among a large number of such switches and therefore do not constitute a significant area overhead to the overall circuit. The resistance R1 could be replaced by the MOSFET $M_{R1}$ shown in FIG. 3.

The operation of the circuit shown in FIG. 5 is as follows: Programming the switch on is similar to the operation of the circuit of FIG. 2, in the example previously described, in that the supply voltage $V_{dd}$ is changed during programming to provide the difference voltage $V_{dd} V_{tb}$ across the gates of the DMOS FETs $M_{D1}$ and $M_{D2}$. Turning off the switch is accomplished in a different manner, however. Whereas in the embodiment of FIG. 2, a separate turn-off circuit is provided, in the embodiment shown in FIG. 5, both the turn-on and the turn-off programming voltages (corresponding to different transitions of voltage $V_{dd}$) are applied to the common gates of the switch via the transistor $M_4$. During switch turn-off, the difference $V_{dd} V_{tb}$ is brought near zero. So two programming cycles are required. In the first cycle, $V_{dd} V_{tb}$ is sufficient to turn on the DMOS switches (typically 5 V). In the next cycle, $V_{dd} V_{tb}$ is near enough to zero to turn off the switch with adequate isolation. The gate control voltage $V_P$ is active on the cycle in which $V_{dd} V_{tb}$=5 V, whereas the gate control voltage $V_N$ is active on the cycle in which $V_{dd} V_{tb}$=0 V.

Thus, in the embodiment shown in FIG. 5, the voltage $V_{dd}$ will transition between three voltage levels. When the ultrasound transducer is driven, the transmit pulse goes up to a high drive voltage, for example, 40 V. During driving of the transducer, $V_{dd}$ must be equal to at least the drive voltage, i.e., 40 V. During programming of the switch relative to the transducer bias voltage $V_{tb}$, however, the voltage $V_{dd}$ will transition down to two different voltage levels. For the purpose of discussion, it will be assumed that $V_{tb}$ is 20 V. Then in order to turn on the switch, the voltage $V_{dd}$ must transition from 40 V to a level whereat the difference between $V_{dd}$ and $V_{tb}$ is 5 to 10 V, depending on the gate-source voltage $V_{gs}$ at which the switch transistors turn on. In this case, $V_{dd}$ must transition from 40 V to 25–30 V for switch turn-on. To turn the switch off, $V_{dd}$ must be made as close as possible to $V_{tb}$, e.g., $V_{dd}$ must transition from 40 V to as close to 20 V as possible.

Still referring to FIG. 5, the gate-source voltage of transistor $M_4$ is kept at zero volts until the switch is to be programmed on. This is accomplished by first lowering the voltage $V_{dd}$ to the turn-on programming voltage and then turning transistor $M_4$ on. To turn transistor $M_4$ on, its gate voltage is lowered below its source voltage by about 5 V, and in this case 5 V below whatever the turn-on programming voltage will be. This lowering of the gate voltage of transistor $M_4$ is accomplished by activating the gate control voltage $V_P$.

After the switch is turned on, the voltage $V_{dd}$ needs to return to the high voltage, i.e., 40 V in the example given above, for the reasons previously described with reference to FIG. 2.

To turn the switch off, the voltage $V_{dd}$ must transition from the high voltage (e.g., 40 V) to the turn-off programming voltage (e.g., 20 V). More generally, $V_{dd}$ must be made as close as possible to $V_{tb}$. To keep the transistor $M_4$ turned on, its gate voltage must be lowered below its new source voltage, i.e., the turn-off programming voltage level of $V_{dd}$, by about 5 V. This lowering of the gate voltage of transistor $M_4$ is accomplished by activating the gate control voltage $V_N$.

All of the circuits shown in FIGS. 1–5 have the following advantages in common: (1) low power since there is no static current dissipation to keep the device in the ON or OFF state; power is only dissipated during transition from one state to the next state; (2) state memory since the switch state is effectively stored on the switch gate capacitance; and (3) cascadable switches due to the absence of a static bias current and voltage drop in the ON state. Moreover, the circuits depicted in FIGS. 2–5 have reduced size, i.e., improved circuit density, as compared to the circuit shown in FIG. 1. In particular, because the embodiment shown in FIG. 5 has only one transistor and the level shifters are common to multiple switches, the size of the circuit is reduced as compared to the circuits depicted in FIGS. 1–4. In addition, the embodiment of FIG. 3, in which a bias MOSFET is substituted for a transducer bias resistor, provides improved flexibility due to controlled bias resistance.

Instead of placing the level shifters in front of the control logic (as shown in FIG. 5), they can be replaced by a single level shifter between the control logic and the programming transistor $M_4$ for each switch. In the latter case, the control logic is non-floating. This would require having level shifters in every switch cell, but is a viable way to implement the invention.

In the circuit shown in FIG. 5, the global bias voltage (referred to herein as the "programming voltage") is not static, but rather changes during the programming cycle. However, it is also possible to change the final programmed voltage which is left on the switch FET gates in order to program different ON resistances for the individual switches. This can be done by carefully selecting the level that the programming voltage assumes during that part of the programming cycle which turns the switch on and sets the gate-source voltage of the switch FETs. So while the programming cycle itself remains largely unchanged from switch to switch, the actual programmed gate-source voltage will be different from one switch to the next according to a pattern which is predefined and stored in the programming circuit which is external to the array. In this way, the programming voltage changes from switch to switch in order to provide different voltages on the DMOS FETs in the ON state to change the resistance. During the programming cycle, the global bias voltage undergoes many more changes depending on whether the switch-on or switch-off programming cycle is involved, but always returns to the highest voltage (e.g., 40 V or 100 V) once programming is completed to allow the high-voltage pulse to be passed or blocked correctly.

One feature of the circuit of FIG. 5 is that the programming transistor $M_4$ has its source and body shorted together. This is a useful feature since it will help prevent latch-up, which is a concern in CMOS circuits. It also eliminates the need for an additional voltage line to be routed through the circuit to bias the body terminal of the device.

The foregoing connection also causes a switch that is programmed ON to be reset by the OFF programming pulse by providing a discharge path through the parasitic drain-body diode of the programming transistor. This effect means that when programming an array of switch cells it is not possible to selectively program some cells off and leave others on: all cells will be automatically reset since the programming pulse is seen by all cells in parallel. This feature is not an issue when all cells are reprogrammed each time that the programming cycle occurs, as is the case with an array that has local digital memory to retain the switch state. However, in the absence of local digital memory, it will be useful to allow for an OFF programming cycle in which switches that are ON are not affected.

Figure 6:
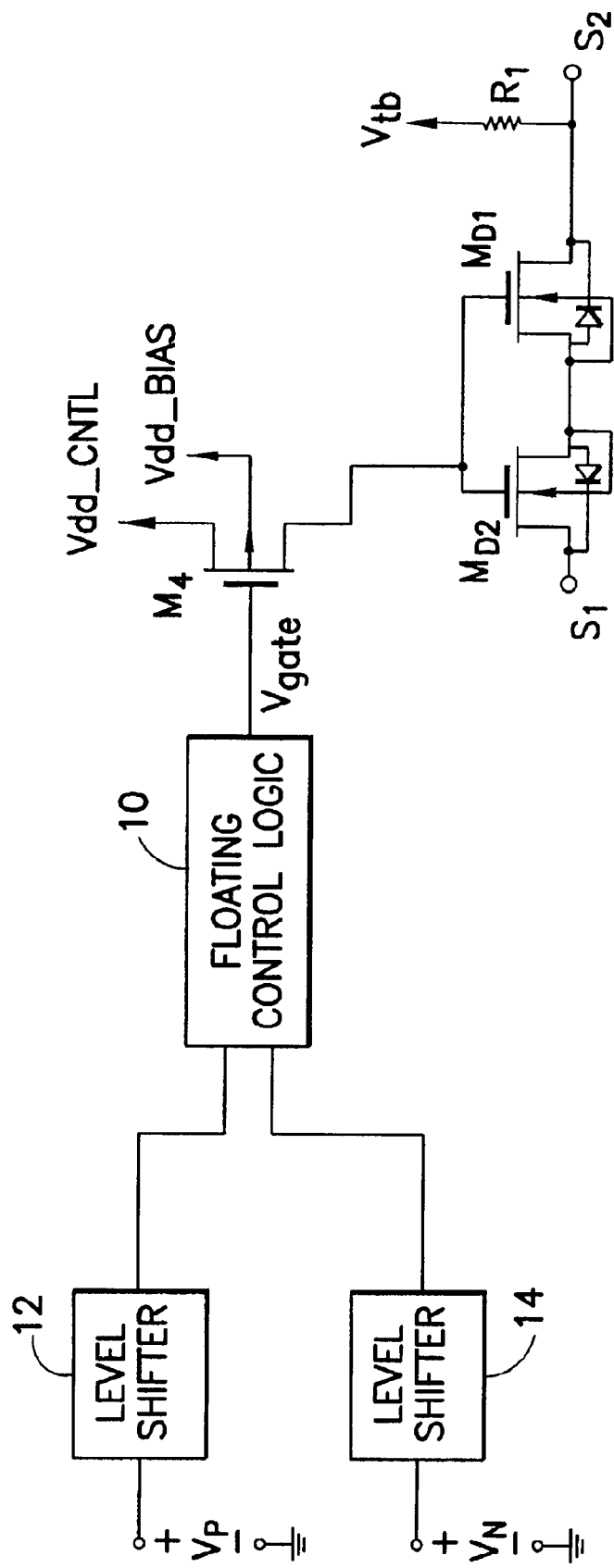
FIG. 6 is a diagram showing a high-voltage switching circuit with floating control logic in accordance with a variation of the embodiment shown in FIG. 5.

FIG. 6 is a schematic of a high-voltage switch with improved OFF state programming. The circuit of FIG. 6 provides a slight modification to the circuit of FIG. 5 that makes it possible to program OFF only those switches that have been selected. By disconnecting the body terminal from the source of the programming transistor $M_4$ and tying it to a separate bias voltage Vdd_BIAS, the path for discharging the DMOS FETs during the OFF programming cycle is eliminated. $V_{dd\_BIAS}$ is typically kept constant at the highest voltage that will be seen by the source of the programming transistor $M_4$ (for example, 100 V). Whereas the programming voltage $V_{dd\_CNTL}$ will transition from this high voltage to the lower programming voltages (e.g., 25 V ON, 20 V OFF), $V_{dd\_BIAS}$ remains at the high voltage to constantly reverse bias the parasitic drain diode of the programming transistor, thereby preventing it from discharging the gates of the DMOS FETs.

Another path by which the DMOS FETs can be discharged is if the programming FET $M_4$ itself is turned on unintentionally. This might occur if the gate voltage of $M_4$ were kept at a lower potential than the gate voltages of the DMOS FETs. This situation could occur in the circuit of FIG. 6 if the floating control logic 10 were biased relative to the programming voltage Vdd_CNTL without additional circuitry to prevent the anomalous condition from occurring. This situation can be prevented by careful choice of programming voltages as described below.

Figure 7:
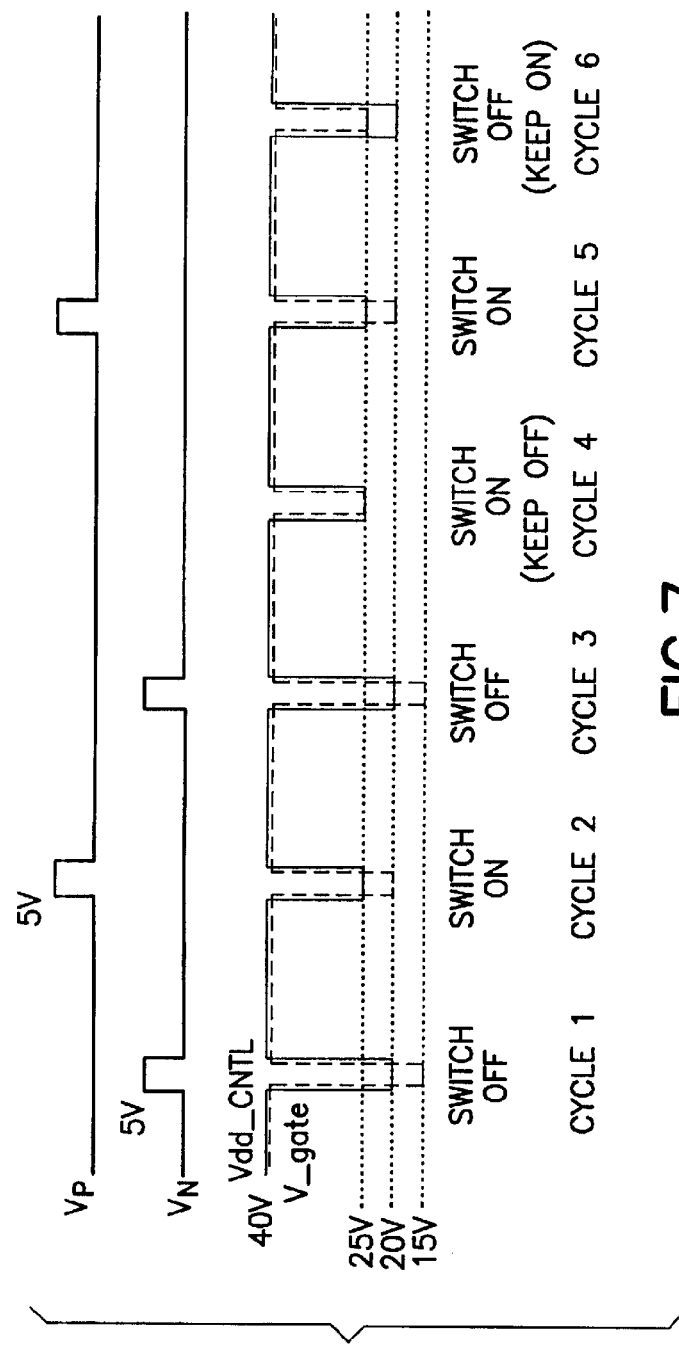
FIG. 7 is a graph showing the gate control voltages $V_P$ and $V_N$, the programming transistor gate voltage $V_{gate}$ (dashed lines) and the programming voltage $V_{dd\_CNTL}$ for the circuit depicted in FIG. 6.

FIG. 7 shows a typical sequence of programming cycles that demonstrates how the embodiment of FIG. 6 works. The dashed line represents the voltage seen at the gate of the programming transistor $M_4$, while the solid line represents the voltage seen at the source of the programming transistor, which programming voltage has been called $V_{dd\_CNTL}$. In this example, it is assumed that the drain (and therefore the source) connections of the DMOS FETs are biased at 20 V. Therefore turning the switch on and off will be accomplished by changing the DMOS FET gate voltage relative to the 20 V transducer bias voltage ($V_{tb}$). The control signals $V_P$ and $V_N$ are TTL or CMOS levels referenced to ground. These are level shifted up to the level of the floating control logic 10, which then uses these signals along with global programming cycle signals (not shown) to set the correct gate voltage ($V_{gate}$) for the programming transistor.

The sequence begins with the first cycle, which turns the switch off. This is accomplished by driving the DMOS gate voltages to be the same as their drain/source voltages (i.e., 20 V). The voltage is applied through the programming transistor $M_4$ by bringing its source to be 20 V while at the same time biasing its gate at 5 V less than the programming voltage (i.e., 15 V) to turn it on. Note that after each cycle, both the programming voltage and the programming transistor gate voltage return to the system high voltage (in this example, 40 V). This is important because without this feature, the switch would not be able to pass or block the high-voltage transmit pulse correctly.

The second cycle turns the DMOS FETs on. This time the required programming voltage is 25 V and the gate of the programming transistor is kept at 20 V in order to again turn on the programming transistor and so that the programming voltage can pass through to the gates of the switch FETs.

In the third cycle, the switch is turned off again in preparation for the fourth cycle. The fourth cycle demonstrates the case wherein the switch is kept off even though the programming voltage would indicate that the switch should be turned on. This cycle is very important since it is likely to occur in an array of switches where not all of the switches need be turned on during a given programming cycle. Because the programming voltage bus ($V_{dd\_CNTL}$) is common to all switches in the array, every switch will see the ON voltage during the ON programming cycle. Those switches which must be kept off will have their programming FETs turned off by biasing the gate of these devices at the same voltage as the ON voltage (here 25 V).

In the fifth cycle, the switch is turned on again in preparation for the sixth cycle. The sixth cycle demonstrates the case in which the switch is kept on even though the programming voltage would indicate that the switch should be turned off. Again, this case is important since in an array there are likely to be many switches that need to be kept on while some of the other switches are turned off.

An important feature for the sixth cycle is that the programming transistor gate voltage is actually 5 V greater than the programming voltage. This is done in order to prevent the programming transistor from bleeding charge from the DMOS FETs ($M_{D1}$ and $M_{D2}$ in FIG. 6). Ordinarily, the programming transistor gate voltage would be the same as the programming voltage to maintain the ON state (as is the case in the fourth cycle, where the OFF state is maintained). However, since the DMOS FETs are in the ON state and therefore have 25 V at their gates, applying the programming voltage (20 V) to the gate of the programming FET would cause the gate-drain junction of this device to turn on. This in turn would allow charge to bleed off of the DMOS FET gates, thereby turning off the switch when it is meant to be kept on.

It is important that $V_{dd\_GNTL}-V_{gate}$ never be greater than the breakdown voltage of the MOSFET gate. This can be accomplished using the following pulse waveform depicted in FIG. 8. Here $V_{gate}$ follows $V_{dd\_CNTL}$ closely except where it drops down in the middle. This middle excursion is where the programming transistor gate voltage is actually programmed. Actually, the width of the drop down pulse can be equal to the width of the $V_{dd\_CNTL}$ pulse (but not greater than) as long as at no point is $V_{dd\_CNTL}-V_{gate}$ greater than the gate voltage that breaks down the gate (typically 5–10 V in high-voltage CMOS transistors).

It should be appreciated that the programming sequence in FIG. 7 is not the required order of events in terms of Cycle 1 before Cycle 2, etc. Generally, Cycle 1, Cycle 2, Cycle 4 and Cycle 6 are unique and independent. These can and will occur in any order either before transmit, after transmit during receive, and even in some cases during transmit (on other channels). The present invention is not limited to a particular order of operations for the different switching cycles shown in FIG. 7.

In accordance with one mode of operation, all switches in an array are reset by programming all of them using an OFF cycle (Cycle 1 in FIG. 7). The programming circuit then turns on only those switches that need to be turned on using the ON cycle (Cycle 2 in FIG. 7).

Any of the circuits shown in FIGS. 2–6 can be used as part of a cascade of switches. The exemplary cascade shown in FIG. 8 comprises three switches X1, X2 and X3 connected in series, although it should be understood that more than three switches can be cascaded in the manner shown. The states of the switches X1 through X3 are controlled by respective switch control circuits C1 through C3. For the purpose of this example, each of the control circuits may operate in the manner described above with reference to FIG. 7.

Figure 8:
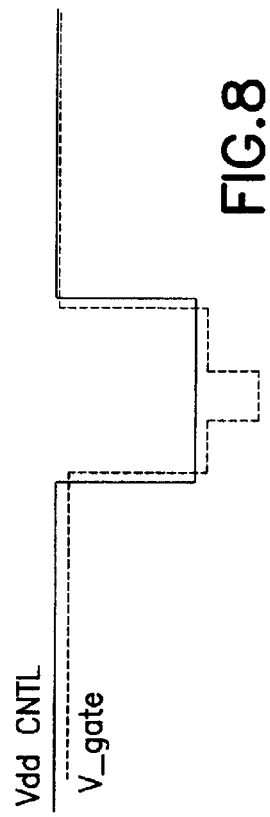
FIG. 8 is a graph showing the programming transistor gate voltage $V_{gate}$ (dashed line) and the programming voltage $V_{dd\_CNTL}$ In more detail.
Figure 9:
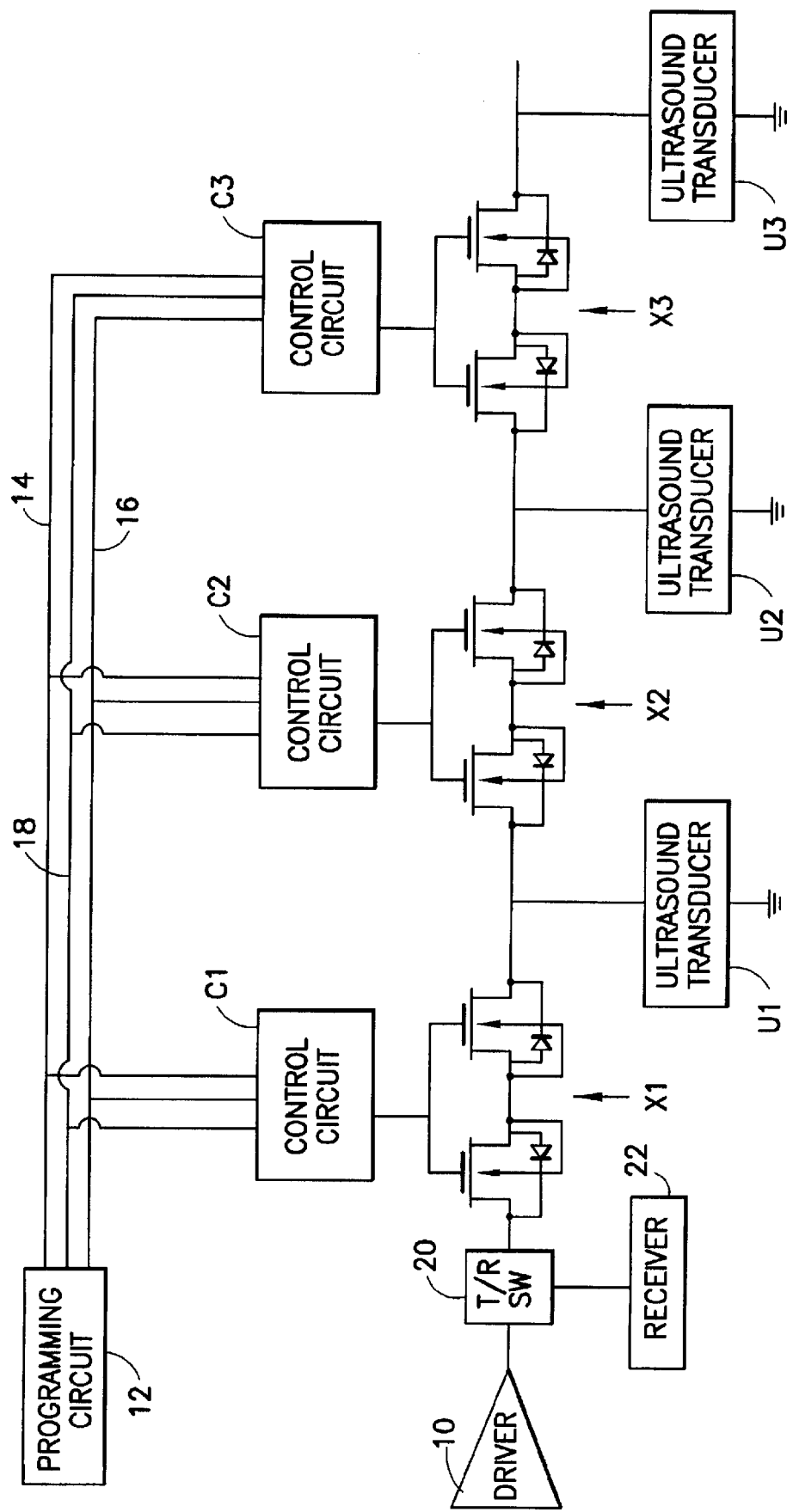
FIG. 9 is a diagram of a cascade of high-voltage switching circuits for selectively driving ultrasound transducers of an array.

There is a digital circuit (not shown) that controls $V_N$ and $V_P$ in each of the circuits disclosed above. In one embodiment, this digital circuit has local memory of the state of the switch. An external control system (programming circuit 12 in FIG. 8) programs all of the switch memories to be in either the ON, OFF or NO_CHANGE state using one or more DATA lines 18. Then a global select line 14 (see FIG. 8) is used to apply the state to the actual switch control circuit. So until the select line is actuated, $V_N$ and $V_P$ are both zero. In this state the switch itself retains its last state. When the global select line 14 is actuated, the stored switch state is transferred to the switch itself by either bringing $V_N$ high (turn off the switch), $V_P$ low (turn on the switch), or $V_N$ and $V_P$ both low (no change to the switch state). The global switch gate programming voltage terminals of each switch X1–X3 in FIG. 8 are connected to a bus 16. The bus 16 carries the programming voltages Vdd_CNTL described above.

The global select line 14, in conjunction with the global switch gate programming voltage bus 16, allow the turn-on voltage of each switch X1–X3 to be programmed independently. More specifically, each switch can be programmed with its own unique gate turn-on voltage that can be used to adjust the switch ON resistances of all switches in the array to correct for variation due to processing. As used herein, the term "ON resistance" means the resistance between the drain and the source of the MOSFET when the device is turned on. The value of this resistance is determined by the gate-source voltage as well as many of the process parameters in the manufacturing. Since the process parameters will vary across the wafer, it is likely that the ON resistance will differ from switch to switch depending on where on the wafer the chip came from. Such process variation can be corrected for by changing the voltage on the gate of the MOSFET. By programming different gate voltages, one can program different ON resistances. This technique can be used to correct for variations in device characteristics as well as to program controlled ON resistance values for other applications.

In an array, the ON resistance can be controlled using the programming waveform of FIG. 7 by changing the gate voltage that is applied during the ON cycle from switch to switch. First all switch control circuits are deselected (i.e., forcing $V_N$ and $V_P$ low in all circuits using the global select line 14) and then the gate voltage for a first switch is applied on the global gate voltage bus 16. The (first) switch that will receive this voltage is then "programmed" to the ON state (i.e., the switch is activated such that its resistance drops from the megaohm range to hundreds of ohms and current begins to flow between the source and drain of the device). Once the voltage has stabilized, the programming circuit 12 is turned off. Then the gate voltage for a second switch is applied on the global gate voltage bus 16. The (second) switch that will receive this voltage is then programmed on. This sequence can be repeated until every switch in the array receives its proper turn-on voltage. Also, groups of switches that have similar turn-on voltages can be biased simultaneously by not changing the global gate voltage before turning each switch in that group on. Lastly, in an array separate programming voltage buses 16 could be used for each row of switches to increase the speed of programming.

Still referring to FIG. 8, a first ultrasound transducer U1 can be driven by the ultrasound driver 10 when a transmit/receive (T/R) switch 20 is in its transmit switch state and switch X1 is turned on; a second ultrasound transducer U2 can be driven by the ultrasound driver 10 when T/R switch 20 is in its transmit switch state and switches X1 and X2 are both turned on; and a third ultrasound transducer U3 can be driven by the ultrasound driver 10 when T/R switch 20 is in its transmit switch state and switches X1, X2 and X3 are all turned on. In this case, assuming no bias resistors, in order to provide a DC path during programming, a turn-on sequence must be followed. For example, given three switches: X1, X2, and X3 cascaded from left to right with switch X1 connected to the ultrasound driver, first X1 must be turned on. This will connect the terminal shared by X1 and X2 to the ultrasound driver through X1. Next, X2 can be turned on, which will also connect the terminal shared by X2 and X3 to the driver. Finally, X3 can be turned on also. In the receive mode, the return signals detected by the respective ultrasound transducers are received by a receiver 22 via the respective switches and via the T/R switch 20 switched to its receive switch state.

Before the switches can be programmed to correct for processing variations, calibration must be performed. Depending on the level of accuracy needed, calibration could be done on one or two representative switches (e.g., at either end of an array of switches) and, in the latter case, an average used. Calibration could also be done a single time (e.g., during production) and then used during operation. More complex algorithms which are a function of groups of some or all of the switches could also be used. These might include histograms, median functions, statistical processes, etc. that would best determine a representative indicator for calibration. Calibration could also be done repeatedly during operation to correct for shifts in parameters due to temperature variation. Furthermore, switch resistance could also be adjusted by the system in some applications to improve delay and/or attenuation in certain applications.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

What is claimed is:

1. A method of operating a switch having ON and OFF states and having a parasitic gate capacitance, said switch comprising a pair of DMOS FETs having a shared gate terminal, the sources of said DMOS FETs being connected to each other and the drains of said DMOS FETs being connected to the input and output terminals of said switch respectively, and said shared gate terminal being connected to a drain of a programming transistor, the gate of said programming transistor receiving a gate voltage, the source of said programming transistor receiving a programming voltage, and the drains of said DMOS FETs being biased at a bias voltage level, comprising the following steps:

(a) transitioning from a first level of said programming voltage to a second level of said programming voltage, said second level of said programming voltage being lower than said first level of said programming voltage and being higher than said bias voltage level by an amount sufficient to turn on said switch; and (b) transitioning from a first level of said programming transistor gate voltage to a second level of said programming transistor gate voltage, said first level of said programming transistor gate voltage being approximately equal to said first level of said programming voltage, and said second level of said programming transistor gate voltage being lower than said second level of said programming voltage by an amount sufficient to turn on said programming transistor, whereby said second level of said programming voltage is applied to said shared gate terminal of said switch via said programming transistor.

2. The method as recited in claim 1, further comprising the following steps performed after step (b):

(c) transitioning from said second level of said programming voltage back to said first level of said programming voltage;

(d) transitioning from said second level of said programming transistor gate voltage back to said first level of said programming transistor gate voltage; and (e) applying a signal voltage level to said input terminal of said switch that is not greater than said first level of said programming voltage, while said switch is turned on.

3. The method as recited in claim 2, further comprising the following steps:

(f) transitioning from said first level of said programming voltage to a third level of said programming voltage lower than said second level of said programming voltage and close enough to said bias voltage level that said switch is turned off; and (g) transitioning from said first level of said programming transistor gate voltage to a third level of said programming transistor gate voltage lower than said third level of said programming voltage by an amount sufficient to turn on said programming transistor, whereby said third level of said programming voltage is applied to said shared gate terminal of said switch via said programming transistor.

4. The method as recited in claim 3, further comprising the following steps:

transitioning from said first level of said programming voltage to said second level of said programming voltage; and transitioning from said first level of said programming transistor gate voltage to a fourth level of said programming transistor gate voltage close enough to said second level of said programming voltage to turn off said programming transistor.

5. The method as recited in claim 1, further comprising the following steps performed after step (b):

(c) transitioning from said second level of said programming voltage back to said first level of said programming voltage;

(d) transitioning from said second level of said programming transistor gate voltage back to said first level of said programming transistor gate voltage;

(e) after step (c), transitioning from said first level of said programming voltage to a third level of said programming voltage lower than said second level of said programming voltage and close enough to said bias voltage level that said switch would be turned off if said third level of said programming voltage were applied to said shared gate terminal of said switch; and (f) after step (d), transitioning from said first level of said programming transistor gate voltage to a third level of said programming transistor gate voltage greater than said third level of said programming voltage, whereby said programming transistor is turned off.

6. A circuit comprising:

a switch having ON and OFF states and having a parasitic gate capacitance, said switch comprising a pair of DMOS FETs having a shared gate terminal, the sources of said DMOS FETs being connected to each other and the drains of said DMOS FETs being connected to the input and output terminals of said switch respectively, and biased at a bias voltage level; and a control circuit for turning said switch on and off, said control circuit comprising:

a programming transistor having its drain connected to said shared gate terminal of said switch, its source connected to receive a programming voltage, and its gate connected to receive a programming transistor gate voltage;

first circuitry for causing a first transition from a first level of said programming voltage to a second level of said programming voltage, said second level of said programming voltage being lower than said first level of said programming voltage and being higher than said bias voltage level by an amount sufficient to turn on said switch; and second circuitry for causing a second transition from a first level of said programming transistor gate voltage to a second level of said programming transistor gate voltage, said first level of said programming transistor gate voltage being approximately equal to said first level of said programming voltage, and said second level of said programming transistor gate voltage being lower than said second level of said programming voltage by an amount sufficient to turn on said programming transistor, whereby said second level of said programming voltage is applied to said shared gate terminal of said switch via said programming transistor.

7. The circuit as recited in claim 6, wherein said programming transistor is a PMOS transistor.

8. The circuit as recited in claim 6, wherein said second circuitry comprises floating control logic.

9. The circuit as recited in claim 6, wherein said second circuitry comprises a level shifter.

10. The circuit as recited in claim 6, wherein after said second transition, said first circuitry causes a third transition from said second level of said programming voltage back to said first level of said programming voltage, and said second circuitry causes a fourth transition from said second level of said programming transistor gate voltage back to said first level of said programming transistor gate voltage.

11. The circuit as recited in claim 10, further comprising a driver circuit coupled to said input terminal of said switch, and an ultrasound transducer coupled to said output terminal of said switch and driven by said driver circuit when said switch and said driver circuit are both turned on.

12. The circuit as recited in claim 6, further comprising a receiver coupled to said input terminal of said switch, and an ultrasound transducer coupled to said output terminal of said switch, said ultrasound transducer being coupled to said receiver when said switch and said receiver are both turned on.

13. The circuit recited in claim 10, wherein said first circuitry causes a fifth transition from said first level of said programming voltage to a third level of said programming voltage lower than said second level of said programming voltage and close enough to said bias voltage level that said switch is turned off; and said second circuitry causes a sixth transition from said first level of said programming transistor gate voltage to a third level of said programming transistor gate voltage lower than said third level of said programming voltage by an amount sufficient to turn on said programming transistor, whereby said third level of said programming voltage is applied to said shared gate terminal of said switch via said programming transistor.

14. The circuit as recited in claim 13, wherein after said sixth transition, said first circuitry causes a seventh transition from said third level of said programming voltage back to said first level of said programming voltage, and said second circuitry causes an eighth transition from said third level of said programming transistor gate voltage back to said first level of said programming transistor gate voltage, and after said eighth transition, said first circuitry causes a ninth transition from said first level of said programming voltage back to said second level of said programming voltage, and said second circuitry causes a tenth transition from said first level of said programming transistor gate voltage to a fourth level of said programming transistor gate voltage close enough to said second level of said programming voltage to turn off said programming transistor.

15. The circuit as recited in claim 6, wherein after said second transition, said first circuitry causes a third transition from said second level of said programming voltage back to said first level of said programming voltage, and said second circuitry causes a fourth transition from said second level of said programming transistor gate voltage back to said first level of said programming transistor gate voltage, and after said third transition, said first circuitry causes a fifth transition from said first level of said programming voltage to a third level of said programming voltage lower than said second level of said programming voltage and close enough to said bias voltage level that said switch would be turned off if said third level of said programming voltage were applied to said shared gate terminal of said switch, and said second circuitry causes a sixth transition from said first level of said programming transistor gate voltage to a third level of said programming transistor gate voltage greater than said third level of said programming voltage, whereby said programming transistor is turned off.

16. The circuit as recited in claim 6, further comprising a third circuit for turning off said switch, said third circuit comprising a transistor having its drain connected to said shared gate terminal of said switch and having its source connected to said connected sources of said switch.

17. The circuit as recited in claim 6, further comprising:
a plurality of ultrasound transducers;
a driving circuit;
a receiver; and
a plurality of high-voltage switching circuits connected to said plurality of ultrasound transducers, wherein each of said switching circuits comprises a respective switch as recited in claim 6, said driving circuit or said receiver being coupled to any one of said ultrasound transducers by way of one or more of said switches.

18. A circuit comprising:
a switch having ON and OFF states and having a parasitic gate capacitance, said switch comprising a pair of DMOS FETs having a shared gate terminal, the sources of said DMOS FETs being connected to each other and the drains of said DMOS FETs being connected to the input and output terminals of said switch respectively;
a control circuit for turning said switch on and off, said control circuit comprising a first level shifter having an input terminal and an output terminal, and a programming transistor having its drain connected to said shared gate terminal of said switch, having its source connected to a first terminal from which said programming transistor draws current, and having its gate connected to receive a voltage derived from a voltage output by said first level shifter; and
a resistance connected across said switch output terminal and a second terminal,
wherein said switch turns on in response to the following conditions: a first gate control voltage level is applied to said input terminal of said first level shifter that results in said programming transistor passing current, while first and second bias voltage levels are respectively applied to said first and second terminals to produce a switch gate-source voltage that turns said switch on.

19. The circuit as recited in claim 18, wherein said control circuit further comprises:
a second level shifter having an input terminal and an output terminal; and
floating control logic having an output terminal connected to said gate of said programming transistor and having first and second input terminals respectively connected to said output terminals of said first and second level shifters, the voltage level applied to said gate of said programming transistor being a function of the inputs to said floating control logic, wherein said switch turns off in response to the following conditions: a second gate control voltage level is applied to said input terminal of said second level shifter that results in said programming transistor passing current, while third and fourth bias voltage levels are respectively applied to said first and second terminals to produce a switch gate-source voltage that turns said switch off.

20. The circuit as recited in claim 19, wherein said first bias voltage level is greater than said third bias voltage level, while said second and fourth bias voltage levels are equal to each other.

21. The circuit as recited in claim 18, wherein said programming transistor is a PMOS transistor.

22. The circuit as recited in claim 21, wherein said PMOS transistor comprises a body, the body and the source of said PMOS transistor being shorted.

23. The circuit as recited in claim 21, wherein said PMOS transistor comprises a body disconnected from the source of said PMOS transistor and tied to a bias voltage different than the voltage applied at said source of said PMOS transistor.

24. The circuit as recited in claim 21, wherein said drain of said PMOS transistor is connected to said shared gate terminal of said switch without an intervening diode.

25. The circuit as recited in claim 18, further comprising a turn-off circuit comprising:
a second level shifter having an input terminal and an output terminal; and
a gate clamp transistor having its drain connected to said shared gate terminal of said switch, its source connected to a junction of the sources of said DMOS FETs and to said second level shifter, and its gate connected to said second level shifter,
wherein said switch turns off in response to the following conditions: a second gate control voltage is applied to said input terminal of said second level shifter that results in said gate clamp transistor passing current, which has the effect of shorting said shared gate terminal of said switch to said shared source terminal of said switch.

26. The circuit as recited in claim 18, further comprising an ultrasound transducer coupled to said output terminal of said switch and driven by said driver circuit when said switch and said driver circuit are both turned on.

27. The circuit as recited in claim 26, further comprising a programming circuit for changing the voltage applied at said first terminal to a first voltage level when said driver circuit is activated, a second voltage level for turning said switch on, and a third voltage level for turning said switch off, wherein said first voltage level is higher than said second voltage level, and said second voltage level is higher than said third voltage level.

28. The circuit as recited in claim 18, wherein said resistance is provided by a MOSFET having its drain connected to said switch output terminal and its source connected to said second terminal, the gate of said MOSFET being connected to a third terminal.

29. The circuit as recited in claim 28, further comprising a programming circuit for changing the voltage applied at said third terminal to a first voltage level under a first condition of operation and a second voltage level under a second condition of operation.

30. The circuit as recited in claim 18, further comprising:
a plurality of ultrasound transducers;
an ultrasound transducer driving circuit; and
a plurality of high-voltage switching circuits respectively connected to said plurality of ultrasound transducers, wherein each of said switching circuits comprises a respective switch as recited in claim 17, each ultrasound transducer being coupled to a respective output terminal of a respective switch.

31. A device comprising:
a first switch having ON and OFF states and having a parasitic gate capacitance, said first switch comprising a pair of DMOS FETs having a shared gate terminal, the sources of said DMOS FETs being connected to each other and the drains of said DMOS FETs being connected to the input and output terminals of said first switch respectively, and biased at a bias voltage level; and
a first control circuit for turning said first switch on and off, said first control circuit having first and second control states, each of said first and second control states being a function of a programming voltage and a programming gate voltage applied to different terminals of said first control circuit, wherein:
in said first control state of said first control circuit, said programming voltage has a first voltage level and said programming gate voltage has a voltage level less than said first voltage level, resulting in said first switch being on; and
in said second control state of said first control circuit, said programming voltage has a second voltage level less than said first voltage level and said programming gate voltage has a voltage level less than said second voltage level, resulting in said first switch being off.

32. The device as recited in claim 31, wherein said first control circuit also has third and fourth control states, wherein:
in said third control state of said first control circuit, said programming voltage has said first voltage level and said programming gate voltage has a voltage level approximately equal to said first voltage level, resulting in said first switch remaining off; and
in said fourth control state of said first control circuit, said programming voltage has said second voltage level and said programming gate voltage has a voltage level greater than said second voltage level, resulting in said first switch remaining on.

33. The device as recited in claim 31, further comprising:
a driver circuit coupled to said input terminal of said first switch; and
a first ultrasound transducer coupled to said output terminal of said first switch,
wherein said driver circuit drives said first ultrasound transducer with a drive voltage that is not greater than said programming gate voltage while said first control circuit is in said second control state.

34. The device as recited in claim 33, further comprising a receiver circuit and a transmit/receive switch that selectively couples said driver and receiver circuits to said input terminal of said first switch.

35. The device as recited in claim 31, wherein said control circuit comprises a PMOS transistor having its drain coupled to said gate terminal of said first switch, its source coupled to a terminal that receives said programming voltage, and its gate coupled to a terminal that receives said programming gate voltage.

36. The device as recited in claim 35, further comprising a level shifter coupled to said gate of said PMOS transistor.

37. The device as recited in claim 36, further comprising floating control logic disposed between said level shifter and said gate of said PMOS transistor.

38. The device as recited in claim 36, further comprising non-floating control logic, wherein said level shifter is disposed between said non-floating logic and said gate of said PMOS transistor.

39. The device as recited in claim 31, further comprising:
a second switch having ON and OFF states and having a parasitic gate capacitance, said second switch comprising a pair of DMOS FETs having a shared gate terminal, the sources of said DMOS FETs being connected to each other and the drains of said DMOS FETs being connected to the input and output terminals of said second switch respectively, and biased at a bias voltage level; and
a second control circuit for turning said second switch on and off, said second control circuit having first and second control states, each of said first and second control states being a function of a programming voltage and a programming gate voltage applied to different terminals of said second control circuit, wherein:
in said first control state of said second control circuit, said programming voltage has a third voltage level and said programming gate voltage has a voltage level less than said third voltage level, resulting in said second switch being on; and
in said second control state of said second control circuit, said programming voltage has a fourth voltage level less than said third voltage level and said programming gate voltage has a voltage level less than said fourth voltage level, resulting in said second switch being off, wherein said first voltage level of said programming voltage causes said first switch to have a first resistance when said first switch is turned on, and said third voltage level of said programming voltage causes said second switch to have a second resistance different than said first resistance when said second switch is turned on 40 the device as recited in claim 31, wherein said first switch comprises a pair of DMOS FETs having a shared gate terminal, the sources of said DMOS FETs being connected to each other and the drains of said DMOS FETs being connected to said input and output terminals of said first switch respectively, and the sources of said DMOS FETs being biased at a bias voltage approximately equal to said third gate voltage.

40. A method of operating a high-voltage switching circuit, comprising the following steps:

programming a first ON resistance value for said high-voltage switching circuit under a first set of operating conditions, comprising a first value for a predetermined parameter, by applying a first programming voltage to a gate of said high-voltage switching circuit;

determining that said parameter has changed from said first value to a second value under a second set of operating conditions; and programming a second ON resistance value for said high-voltage switching circuit under said second set of operating conditions by applying a second programming voltage different than said first programming voltage to said gate.

41. A method for programming high-voltage switching circuits, comprising the following steps:

(a) manufacturing first and second high-voltage switching circuits;

(b) determining a first gate-source voltage that causes said first high-voltage switching circuit to have a desired ON resistance;

(c) determining a second gate-source voltage that causes said second high-voltage switching circuit to have said desired ON resistance, said first and second gate-source voltages being different;

(d) programming a control circuit to provide a first gate voltage to said first high-voltage switching circuit, said first gate voltage being dependent on the results of step (b); and (e) programming said control circuit to provide a second gate voltage to said second high-voltage switching circuit, said second gate voltage being dependent on the results of step (c), wherein said first and second gate voltages are different but produce approximately the same ON resistances during operation of said first and second high-voltage switching circuits.

* * * * *